US007868454B2

(12) United States Patent
Lin

(10) Patent No.: US 7,868,454 B2
(45) Date of Patent: Jan. 11, 2011

(54) HIGH PERFORMANCE SUB-SYSTEM DESIGN AND ASSEMBLY

(75) Inventor: Mou-Shiung Lin, Hsinchu (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 12/353,255

(22) Filed: Jan. 13, 2009

(65) Prior Publication Data

US 2009/0121221 A1 May 14, 2009

Related U.S. Application Data

(60) Continuation of application No. 12/098,467, filed on Apr. 7, 2008, now Pat. No. 7,535,102, which is a continuation of application No. 10/420,596, filed on Apr. 22, 2003, now Pat. No. 7,378,735, which is a division of application No. 09/849,039, filed on May 4, 2001, now Pat. No. 6,586,266, which is a continuation-in-part of application No. 09/729,152, filed on Dec. 4, 2000, now Pat. No. 6,303,996, which is a division of application No. 09/258,911, filed on Mar. 1, 1999, now Pat. No. 6,180,426.

(51) Int. Cl.
H02L 23/48 (2006.01)
H01L 21/44 (2006.01)

(52) U.S. Cl. .................................... 257/738; 438/107

(58) Field of Classification Search ................ 257/202, 257/676, 738, 777, E25.013; 438/106–108
See application file for complete search history.

(56) References Cited

U.S. PATENT DOCUMENTS 5,386,127 A 1/1995 Furuyama (Continued)

FOREIGN PATENT DOCUMENTS

EP 0767492 4/1997

(Continued)

OTHER PUBLICATIONS

Notice of Reason for Rejection for Japanese Patent Application No. 2002-131172 dated Jun. 19, 2007 w/English Translation Summary.
Final Notice of Reason for Rejection for Japanese Patent Application No. 2002-131172 dated May 19, 2009 w/English Translation Summary.

(Continued)

Primary Examiner—Calvin Lee
(74) Attorney, Agent, or Firm—McDermott Will & Emery LLP

(57) ABSTRACT

A multiple integrated circuit chip structure provides interchip communication between integrated circuit chips of the structure with no ESD protection circuits and no input/output circuitry. The interchip communication is between internal circuits of the integrated circuit chips. The multiple integrated circuit chip structure has an interchip interface circuit to selectively connect internal circuits of the integrated circuits to test interface circuits having ESD protection circuits and input/output circuitry designed to communicate with external test systems during test and burn-in procedures. The multiple interconnected integrated circuit chip structure has a first integrated circuit chip mounted to one or more second integrated circuit chips to physically and electrically connect the integrated circuit chips to one another. The first integrated circuit chips have interchip interface circuits connected each other to selectively communicate between internal circuits of the each other integrated circuit chips or test interface circuits, connected to the internal circuits of each integrated circuit chip to provide stimulus and response to said internal circuits during testing procedures. A mode selector receives a signal external to the chip to determine whether the communication is to be with one of the other connected integrated circuit chips or in single chip mode, such as with the test interface circuits. ESD protection is added to the mode selector circuitry.

31 Claims, 12 Drawing Sheets

U.S. PATENT DOCUMENTS

| | | | |
|---|---|---|---|
| 5,461,333 | A | 10/1995 | Condon et al. |
| 5,481,205 | A | 1/1996 | Frye et al. |
| 5,512,853 | A | 4/1996 | Ueno et al. |
| 5,534,465 | A | 7/1996 | Frye et al. |
| 5,604,365 | A | 2/1997 | Kajigaya |
| 5,731,945 | A | 3/1998 | Bertin et al. |
| 5,773,856 | A | 6/1998 | Bearden |
| 5,807,791 | A | 9/1998 | Bertin et al. |
| 5,818,748 | A | 10/1998 | Bertin et al. |
| 5,903,168 | A | 5/1999 | Yang et al. |
| 5,943,254 | A | 8/1999 | Bakeman, Jr. et al. |
| 6,020,760 | A | 2/2000 | Sample |
| 6,025,618 | A | 2/2000 | Chen |
| 6,043,107 | A | 3/2000 | Merritt |
| 6,072,943 | A | 6/2000 | Gasparik |
| 6,166,560 | A | 12/2000 | Ogura et al. |
| 6,180,426 | B1 | 1/2001 | Lin |
| 6,303,996 | B2 | 10/2001 | Lin |
| 6,397,361 | B1 | 5/2002 | Saitoh |
| 6,586,266 | B1 | 7/2003 | Lin |
| 7,535,102 | B2 * | 5/2009 | Lin ............................ 257/738 |
| 2004/0023450 | A1 | 2/2004 | Katagiri |
| 2008/0185586 | A1 | 8/2008 | Lin |
| 2009/0114914 | A1 | 5/2009 | Lin |
| 2009/0121220 | A1 * | 5/2009 | Lin ............................ 257/48 |

FOREIGN PATENT DOCUMENTS

| | | |
|---|---|---|
| JP | 58-118123 | 7/1983 |
| JP | 63-126263 | 5/1988 |
| JP | 04-007853 | 1/1992 |
| JP | 09-127188 | 5/1997 |
| JP | 10-135431 | 5/1998 |
| JP | 2000-022072 | 1/2000 |
| JP | 2001-022072 | 1/2001 |
| TW | 378404 | 1/2000 |
| TW | 396419 | 7/2000 |
| TW | 410443 | 11/2000 |
| TW | 411608 | 11/2000 |
| TW | 436800 | 5/2001 |
| TW | 440900 | 6/2001 |
| TW | 442834 | 6/2001 |

OTHER PUBLICATIONS

Ezaki, Takayuki et al. "A 160Gb/s Interface Design Configuration for Multichip LSI," IEEE International Solid-State Circuits Conference 2004, Session 7, TD: Scaling Trends, 7.5. Jun. 2004, 8 pages.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp 1-3.

Lin, M.S. "Post Passivation Technology™—MEGIC® Way to System Solutions,"Presentation given at TSMC Technology Symposium, Japan (Oct. 1, 2003) pp. 1-32.

Lin, M.S. et al. "A New IC Interconnection Scheme and Design Architecture for.High Performance ICs at Very Low Fabrication Cost—Post Passivation Interconnection," Proceedings of the IEEE Custom Integrated Circuits Conference (Sep. 24, 2003) pp. 533-536.

Search Report for European Patent Application No. 02368046.5, dated Aug. 5, 2005.

Office Action for European Patent Application No. 02368046.5, dated Dec. 4, 2009.

SEMATECH Dictionary of Semiconductor Terms, Passivation available at www.sematech.org, last visited April 1, 2010, 3 pages.

* cited by examiner

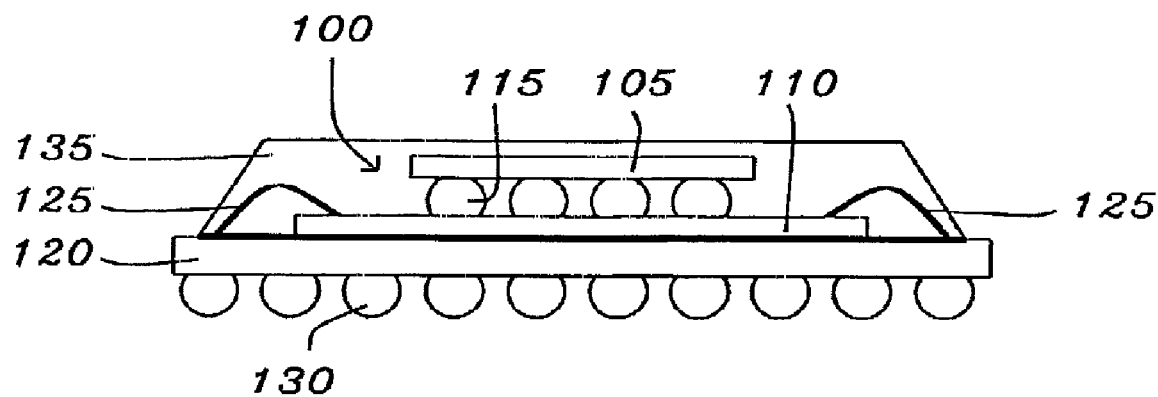
FIG. 1 – Prior Art
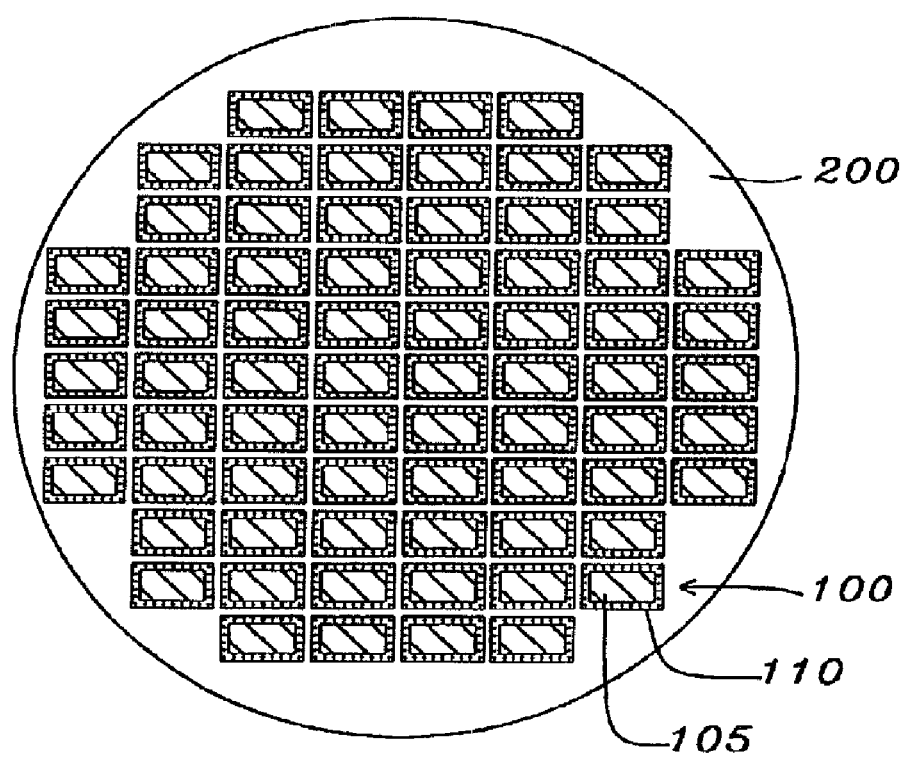
FIG. 2a – Prior Art

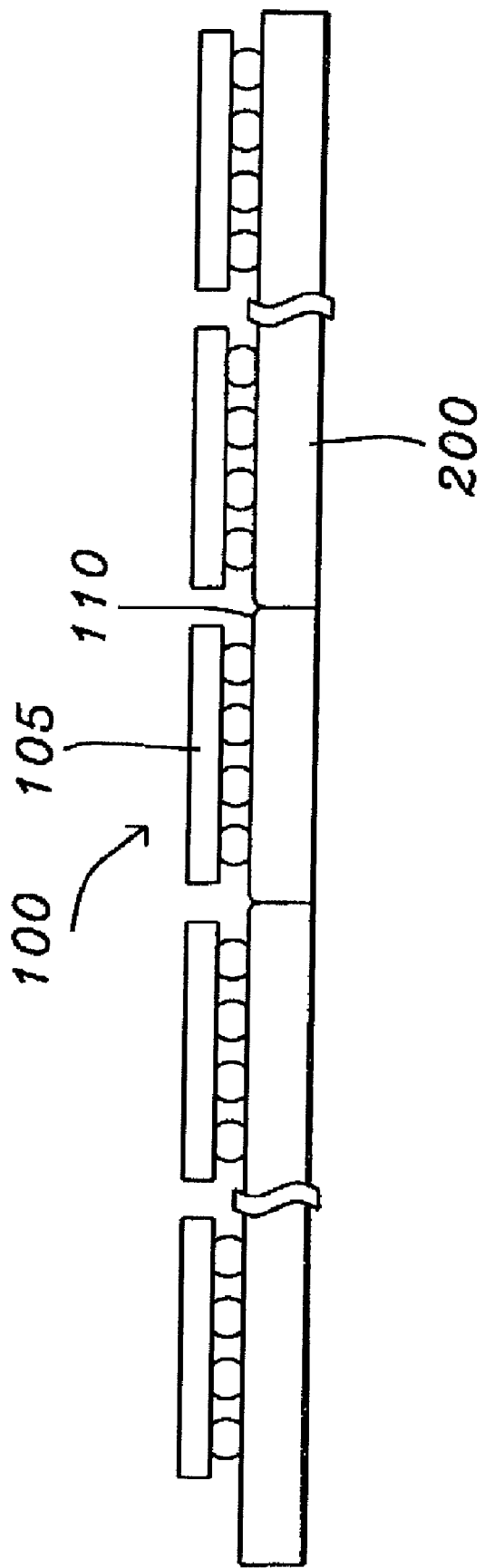
FIG. 2b – Prior Art

HIGH PERFORMANCE SUB-SYSTEM DESIGN AND ASSEMBLY

This application is a continuation of application Ser. No. 12/098,467, filed on Apr. 7, 2008, now issued as U.S. Pat. No. 7,535,102, which is a continuation of application Ser. No. 10/420,596, filed on Apr. 22, 2003, now issued as U.S. Pat. No. 7,378,735, which is a division of application Ser. No. 09/849,039, filed on May 4, 2001, now issued as U.S. Pat. No. 6,586,266, which is a continuation-in-part of application Ser. No. 09/729,152, filed on Dec. 4, 2000, now issued as U.S. Pat. No. 6,303,996, which is a division of application Ser. No. 09/258,911 filed on Mar. 1, 1999, now issued as U.S. Pat. No. 6,180,426.

BACKGROUND OF THE INVENTION

1. Field of the Invention

This invention relates to structures and methods of assembly of integrated circuit chips into interconnected multiple chip modules. More particularly, this invention relates to multiple chip structures connected physically and electrically.

2. Description of the Related Art

The manufacture of embedded Dynamic Random Access Memory (DRAM) requires that process parameters that enhance the performance of the logic or the DRAM, if separately formed on semiconductor chips, be compromised when DRAM is embedded into an array of logic gates on the same semiconductor chip. This compromise has limited the application of embedded DRAM. If there is no compromise in the process parameters to enhance the performance of logic or the embedded DRAM, the manufacturing process becomes very complicated and costly. Moreover, because of the structure of the embedded DRAM and the logic, burn-in of the embedded DRAM is not possible and embedding of DRAM with logic is not a reliable design solution.

A multiple chip module structure is a viable alternative to embedded DRAM. With multiple chips connected in intimate contact, the process parameters that maximize the performance of the DRAM chip and the logic gates can be applied during manufacture. Refer to FIG. 1 for a description of a "chip-on-chip" structure 100. Such a "chip-on-chip" structure is described in U.S. Pat. No. 5,534,465 (Frye et al.). A first integrated circuit chip 105 is attached physically and electrically to a second integrated circuit chip 110 by means of an area array of solder bumps 115. The process of forming an area array of solder bumps 115 is well known in the art and is discussed in Frye et al. '465. The second chip 110 is then secured physically to a substrate 120. Electrical connections 125 between the second integrated circuit chip 110 and external circuitry (not shown) are created as either wire bonds or tape automated bonds. The module further has a ball grid array 130 to secure the structure to a next level of packaging containing the external circuitry. Generally, an encasing material 135 is placed over the "chip-on-chip" structure 100 to provide environmental protection for the "chip-on-chip" 100.

U.S. Pat. No. 5,481,205 (Frye et al.) teaches a structure for making temporary connections to integrated circuit chips having "solder bumps" or connection structures such as ball grid arrays. The temporary connections allow temporary contacting of the integrated circuit chip during testing of the integrated circuit chip.

The handling of wafers from which the integrated circuit chips are formed and the handling of the integrated circuit chips themselves causes the integrated circuit chips to be subjected to electrostatic discharge (ESD) voltages. Even though connections between the first integrated circuit chip 105 and the second integrated circuit chip 110 are relatively short and under normal operation would not be subjected to ESD voltages, ESD protection circuitry is required to be formed within the interchip interface circuit to provide protection or necessary driving capacity for the first integrated circuit chip 105 and the second integrated circuit chip 110 during burn-in and other manufacturing monitoring processes.

U.S. Pat. No. 5,731,945 and U.S. Pat. No. 5,807,791 (Bertin et al.) teach a method for fabricating programmable ESD protection circuits for multichip semiconductor structures. The interchip interface circuit on each integrated circuit chip is formed with an ESD protection circuit and a switch to selectively connect the ESD protection circuit to an input/output pad. This allows multiple identical chips to be interconnected and redundant ESD protection removed.

The circuits at the periphery of integrated circuit chips generally are specialized to meet the requirements of standardized specifications. These include relatively high current and voltage drivers and receivers for communicating on relatively long transmission line media. Alternately, as shown in U.S. Pat. No. 5,461,333 (Condon et al.) the interface may be differential to allow lower voltages on the transmission line media. This requires two input/output pads for transfer of signals.

U.S. Pat. No. 5,818,748 (Bertin et al.) illustrates a separation of chip function onto separate integrated circuits chips. This allows the optimization of the circuits. In this case, EEPROM is on one integrated circuits chip and drivers and decoders are on another. The chips are placed face to face and secured with force responsive self-interlocking micro-connectors.

FIGS. 2a and 2b show multiple "chip-on-chip" structures 100 constructed on a wafer. Not shown is the forming of the first integrated circuit chip on a silicon wafer. The first integrated circuit chip is tested on the wafer and nonfunctioning chips are identified. The wafer is separated into the individual chips. The functioning first integrated circuit chips 105 then are "flip-chip" mounted on the second integrated circuit chip 110 on the wafer 200. The wafer 200 is then separated into the "chip-on-chip" structures 100. The "chip-on-chip" structures 100 are then mounted on the modules as above described.

SUMMARY OF THE INVENTION

An object of this invention is to provide a multiple integrated circuit chip structure where the interchip communication between integrated circuit chips of the structure have no ESD protection circuits and no input/output circuitry. The interchip communication is between internal circuits with a minimal electrical load.

Another object of this invention is to provide a circuit to selectively connect internal circuits of the integrated circuits to test interface circuits having ESD protection circuits and input/output circuitry designed to communicate with test systems during assembly and test.

A further object of the invention is to provide a circuit to selectively connect internal circuits of the integrated circuits to one of two paths, either for single chip mode operation or for multi-chip mode operation.

To accomplish these and other objects, a multiple interconnected integrated circuit chip structure has a first integrated circuit chip physically and electrically connected to one or more second integrated circuit chips. The integrated circuit chips may be connected to one another by means of an area array of solder bumps. The first integrated circuit chip has interchip interface circuits connected to the one or more second integrated circuit chips to communicate between internal circuits of the first and second integrated circuit chips and test circuits. The test circuits are connected to the internal circuits of the first integrated circuit chip to provide stimulus and response to the internal circuits during testing procedures. Additionally, the first integrated circuit chip can be set to be operated in single chip mode, if desired.

The second integrated circuit chips have input/output interface circuitry to communicate with external circuitry connected to the second integrated circuit chips and to protect the second integrated circuit chips from electrostatic discharge voltages. Further, the second integrated circuit chips have interchip interface circuits connected to the first integrated circuit chip and to each other to communicate between the internal circuits of the chips and with test circuits. The test circuits are connected to the internal circuits of the second integrated circuit chips to provide stimulus to and response from the internal circuits during testing and burn-in procedures.

The interchip interface circuitry has an internal interface circuit for transferring electrical signals between the internal circuits of one integrated circuit chip to another integrated circuit chip. The interchip interface circuitry further has a mode select switch to selectively connect between the internal circuits of one integrated circuit chip and another integrated circuit chip or to operate in single chip mode, including stand-alone operation or connection to test interface circuits. The mode select signal to the mode switch is external to the chip. The signal may come from another of the integrated circuit chips, from the substrate, or from a test interface, or other external source. The mode switch has three terminals and a control terminal. The first terminal is connected to an output of the internal interface circuit, a second terminal connected to the internal circuitry, and the third terminal connected to an input/output interface. A mode selector is connected to the control terminal. The state of the mode selector determines the connection between the first terminal and thus the output of the internal interface circuit, the second terminal and thus the internal circuitry, and the third terminal and thus the test interface or other interface. During multi-chip mode operation, the first terminal is connected to the second terminal such that the internal circuits of two integrated circuits are connected through their respective internal interfaces. During single chip mode operations, the internal circuits are connected to an input/output interface. For example, during test and burn-in, the input/output interface may connect to external testing circuitry.

The first integrated circuit chip could be fabricated using a first type of semiconductor process and the second integrated circuit chip would be fabricated with a second type of semiconductor process that is not compatible with the first type of semiconductor process, and so on. As an example, the first integrated circuit chip could be an array of memory cells and the second integrated circuit chip would contain electronic circuitry formed with a process not compatible with a process of the array of memory cells. Alternatively, the second integrated circuit chip is an array of memory cells and the first integrated circuit chip contains electronic circuitry formed with a process not compatible with a process of the array of memory cells. Other integrated circuit chips could be fabricated in other ways. Fabricating the first integrated circuit chip using its optimum semiconductor process, fabricating the second integrated circuit chip using its optimum semiconductor process, and then joining the first and second integrated circuit chips by this invention creates a multiple chip integrated circuit structure having maximum performance with minimum cost.

BRIEF DESCRIPTION OF THE DRAWINGS

FIG. 1 shows a cross-sectional view of a "chip-on-chip" structure of the prior art.

FIGS. 2a and 2b are respectively top view and a cross-sectional view of a "chip-on-chip" structure formed on a-semiconductor wafer of the prior art.

DETAILED DESCRIPTION OF THE INVENTION

Figure 7A:
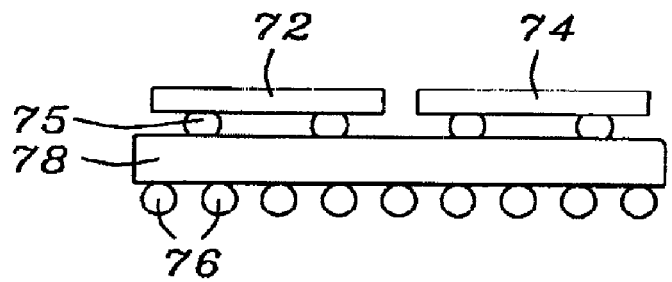
FIGS. 7a through 7d are examples of multiple chip modules that could be made using the process of this invention.
Figure 7B:
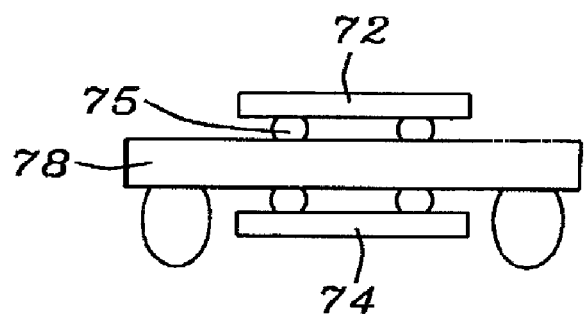
Figure 7C:
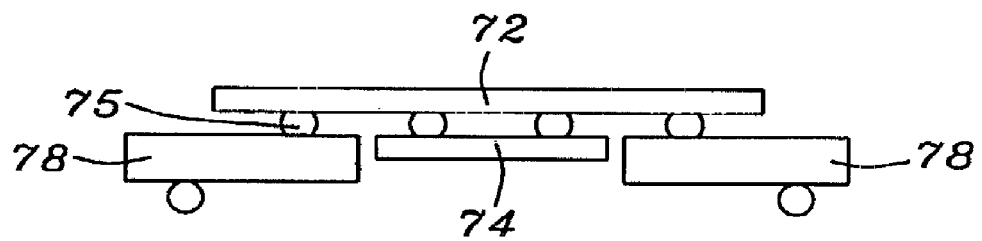
Figure 7D:
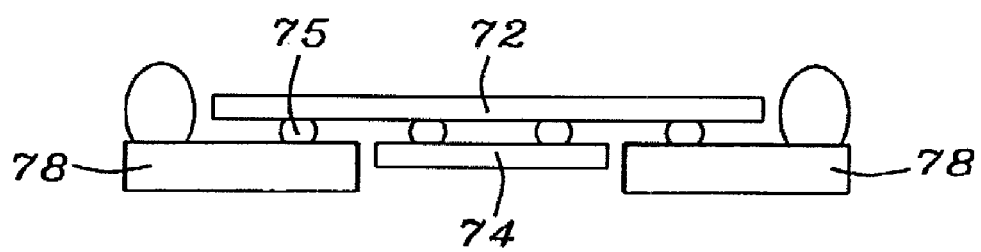

The process and structure of the present invention can be extended to any kind of format of multi-chip module. For example, two or a few chips 72 and 74 may be mounted on the same side of the ball grid array substrate 76 as shown in FIG. 7a. The ball grid array 76 is shown attached to the substrate 78. The substrate can be laminated printed circuit boards, or ceramic, glass, aluminum, copper, or any kind of substrates. FIG. 7b through 7d illustrate other examples of multiple chip configurations. In all of these examples, more than the two chips shown can be connected together. The following figures illustrate a "chip-on-chip" structure. It will be understood by those skilled in the art that the present invention should not be limited to any of the examples shown, but can be extended and applied to any kind of format of multiple chip module.

Figure 3:
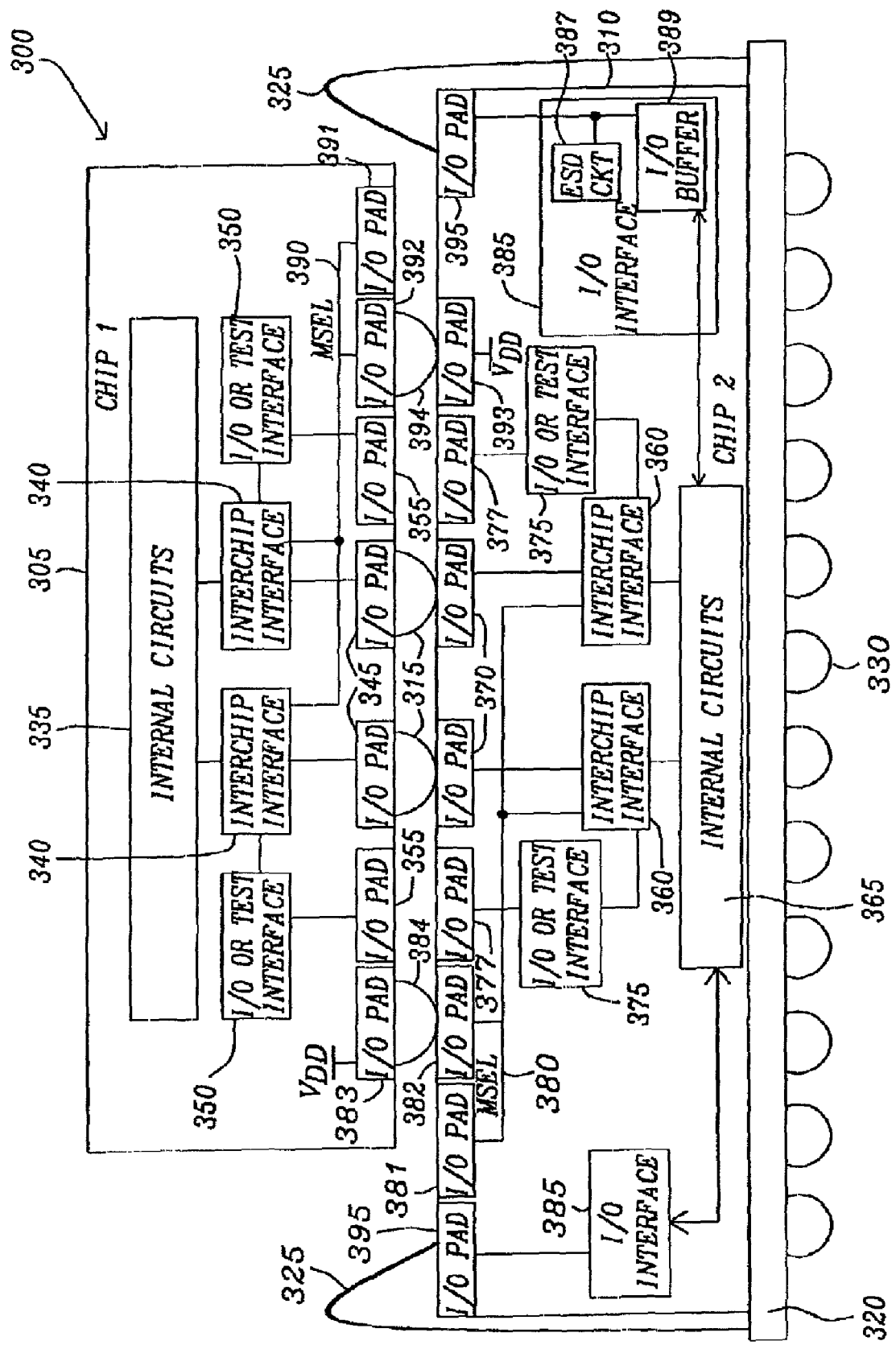
FIG. 3 is a cross-sectional view of a "chip-on-chip" structure, schematically the circuitry contained on each chip of the chip-on-chip structure of this invention.

A "chip-on-chip" structure 300 is shown in FIG. 3. A first integrated circuit chip 305 is attached to a second integrated circuit chip 310 by means of an area array of solder bumps 315, for example, as described above. The second integrated circuit chip 310 is secured physically to the module 320. The electrical connections 325 are either wire bonds or TAB bonds. The module 320 has a ball grid array 330 to attach the "chip-on-chip" structure within the module to a next level of electronic package. It will be understood that more than two chips may be connected in this way and that the chips may be connected on the same side of the ball grid array 330 or on opposite sides.

The first integrated circuit chip 305 has internal circuits 335, which are the functional electronic components of the first integrated circuit chip 305. The internal circuits 335 may be DRAM, logic, or other integrated circuits. Likewise, the second integrated circuit chip 310 has the internal circuits 365. The internal circuits 365 are the functional electronic components of the second integrated circuit chips 310. These internal circuits also maybe DRAM, logic, or other integrated circuits. To transfer signals between the internal circuits 335 of the first integrated circuit chip 305 and the internal circuits 365 of the second chip 310 or to an external test system, the internal circuits 335 are connected to the interchip interface circuits 340. The interchip interface circuits 340 are connected through the input/output pads 345 to the area array of solder bumps 315 and thus to the second chip 310. This connection is functional during multi-chip mode operation, when the first integrated circuit chip 305 is mounted to the second integrated circuit chip 310. These input/output pads 345 have no electrostatic discharge (ESD) circuits or driving circuits. The input/output pads 345 are used in multi-chip modules to bond to other chips, substrates, or other interconnection media.

For single chip operation mode, the interchip interface circuit 340 is bonded to the input/output pads 355 having ESD and driving circuits for standalone performance. The bonding may be by wire bonding, solder bumping, or any other interconnection means to a substrate or any other second level chip carriers. The input/output pads 355 connect to the input/output or test interface 350.

The mode select 390 for the first integrated circuit chip 305 is accomplished by placing an appropriate logic level on the mode select input/output pads 391 and 392. When the first integrated circuit chip 305 is operating in single-chip mode, the mode select input/output pad 391 is brought to a first logic level (0) for stand-alone performance. The system designer could connect the mode selector to an external source (such as from a printed circuit board) which can provide logic level (0).

When the first integrated circuit chip 305 is mounted to the second integrated circuit chip 310 for multi-chip operation, the mode select line 390 is brought to a second logic level (1) through the mode select input/output pad 392. The second logic level (1) is a voltage equal to the power supply voltage source V.sub.DD and is achieved by connecting the mode select input output pad 392 to the mode select input/output pad 393 on the second integrated circuit chip 310 through the solder ball 394. The mode select input/output pad 393 is connected directly to the power supply voltage source V.sub.DD to achieve the second logic level (1). When the mode select line 390 is at the second logic level (1), the interchip interface 340 transfers signals of the internal circuits 335 to the input/output pads 345 to the second integrated circuit chip 310 as described above.

It should be emphasized that the mode select signal is external to the chip. During single-chip mode, such as during testing and burn-in, the mode select signal is from the test probe and the burn-in socket, respectively. These signals to the mode select input/output pad bring the pad to the first logic level (0), as described above. After assembly, when the circuit is in operation, the mode select signal can come from other chips or from the substrate directly to cause signals of the internal circuits to transfer to output pads for one of the other chips, for example. Alternatively, single-chip operation can still be selected after assembly by setting the mode selector to single chip mode. The advantage of this concept is to extend the application for chips having this inventive design to serve multiple purposes. This enhances the commercial value and cost effectiveness of the design.

The internal circuits 365 of the second integrated circuit chip 310 likewise are connected to the interchip interface circuits 360. The interchip interface circuits 360 are connected to the input/output pads 370 and thus to the first integrated circuit chip 310 through the area array of solder bumps 315. The interchip interface circuits 360 are connected to the I/O or test interface circuits 375.

The internal circuits 365 of the second integrated circuit chip 310 are connected to the input/output interface 385. The input/output interface is connected to the input/output pad 395, which is connected to the module 320 through the bondwire 325. The input/output interface provides the circuitry to transfer signals between the internal circuits 365 and the external circuits attached through the next packaging level to the ball grid array 330 and thus to the wirebond 325.

The second integrated circuit chip 310 is tested prior to separation of a wafer containing the second integrated circuit chip 310, by bringing test probes or needles of the test system in contact with the input/output pads 395 and the test input/output pads 377. Subsequent to dicing of the wafer into individual second integrated circuit chips 310, the individual second integrated circuit chips 310 are mounted in a burn-in apparatus. The burn-in apparatus again is brought in contact with the input/output pads 395 and the test input/output pads 377 to provide stressing signals to the circuits of the second integrated circuit chip 310. Then, when the first integrated circuit chip 305 is mounted to the, second integrated circuit chip 310, operation of the whole "chip-on-chip" assembly 300 is verified by attaching testing probes or contacts to the ball grid array 330. Signals from the testing probes are transferred between the circuits of the whole "chip-on-chip" assembly 300 through the bond wires 325 to the input/output pads 395.

The mode select 380 for the second integrated circuit chip 310 is accomplished by placing an appropriate logic level on the mode select input/output pads 381 and 382. When the second integrated circuit chip 310 is in contact with a test system during wafer testing or die testing during burn-in, the mode select input/output pad 381 is brought to a first logic level (0) to cause the interchip interface circuit 360 to transfer signals between the internal circuits 365 and the I/O or test interface 375. The test signals are then transferred between the I/O or test interface 375 and the test input/output pad 377 as described above. Again, it is noted that the mode select signal comes from outside the chip; from the test probe or burn-in socket, for example, in the testing phase.

When the first integrated circuit chip 305 is mounted to the second integrated circuit chip 310 and multi-chip mode is desired, the mode select line 380 is brought to a second logic level (1) through the mode select input/output pad 382. The second logic level (1) is achieved by connecting the mode select input output pad 382 to the mode select input/output pad 383 on the second integrated circuit chip 310 through the solder ball 384. The mode select input/output pad 383 is connected directly to the power supply voltage source V.sub.DD to achieve the second logic level (1). When the mode select line 380 is at the second logic level (1), the interchip interface 360 transfers signals of the internal circuits 365 to the input/output pads 370 to the first integrated circuit chip 305 as described above. The mode select signal comes from the substrate or from the other chips during operation of the circuit.

The input/output interface circuit 385 has an input/output buffer 389 connected to the internal circuits 365. The input/output buffer 389 is either a driver or receiver necessary to translate the signal levels of the internal circuits 365 to the signal levels of the external circuits and the signal levels of the external circuits to the signal levels of the internal circuit 365. The input/output buffer is connected to the input/output pad 395 and to the ESD protection circuit 387. The ESD protection circuit 387 clamps excess ESD voltages to prevent damage to the input/output buffer 389 and the internal circuits 365 from ESD voltages brought in contact with the input/output pad 395 from the external environment.

FIGS. 4*a* through 4*d* illustrate a key feature of the present invention: to provide two alternative input/output paths. One I/O path has an electrostatic discharge (ESD) protection circuit and a driving circuit while the other path has no extra loading. One of the two paths is selected by a mode switch.

Figure 4A:
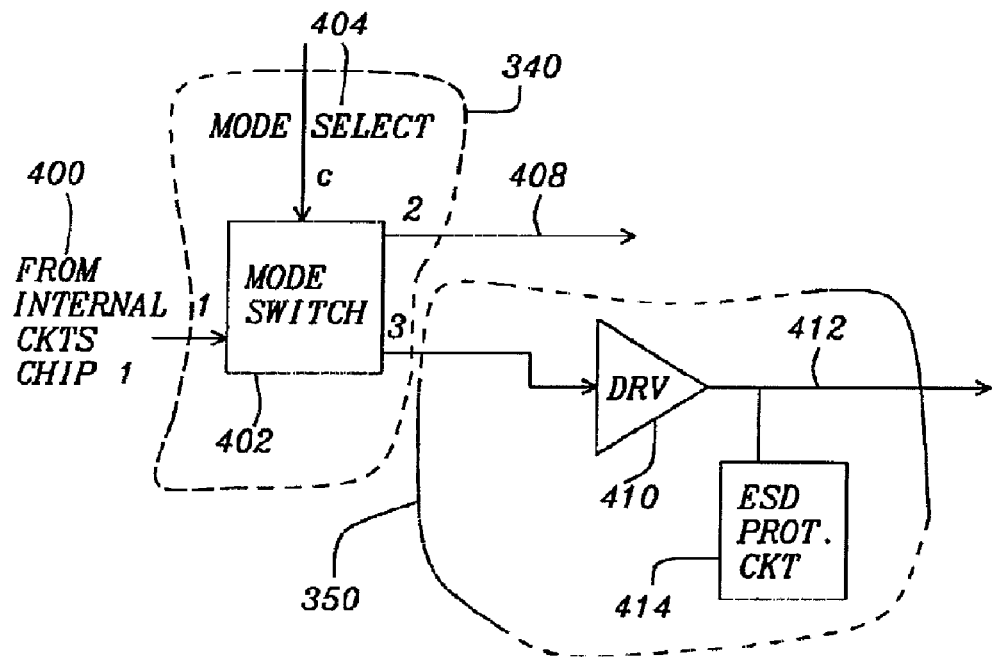
FIGS. 4a-d are schematics of the interchip interface circuits of this invention.
Figure 4B:
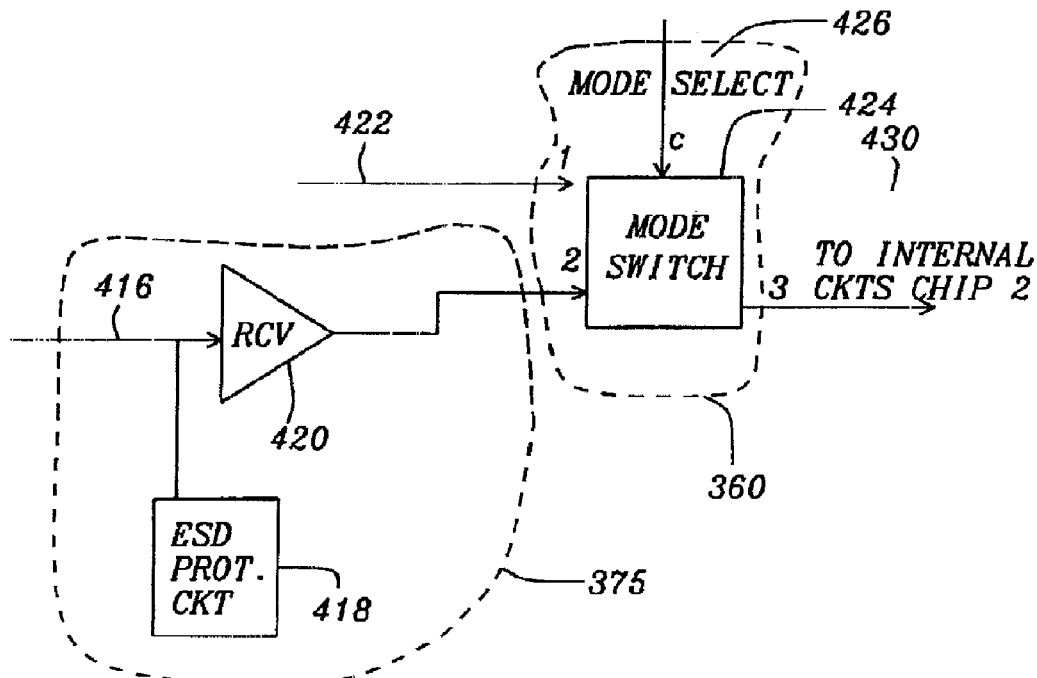
Figure 4C:
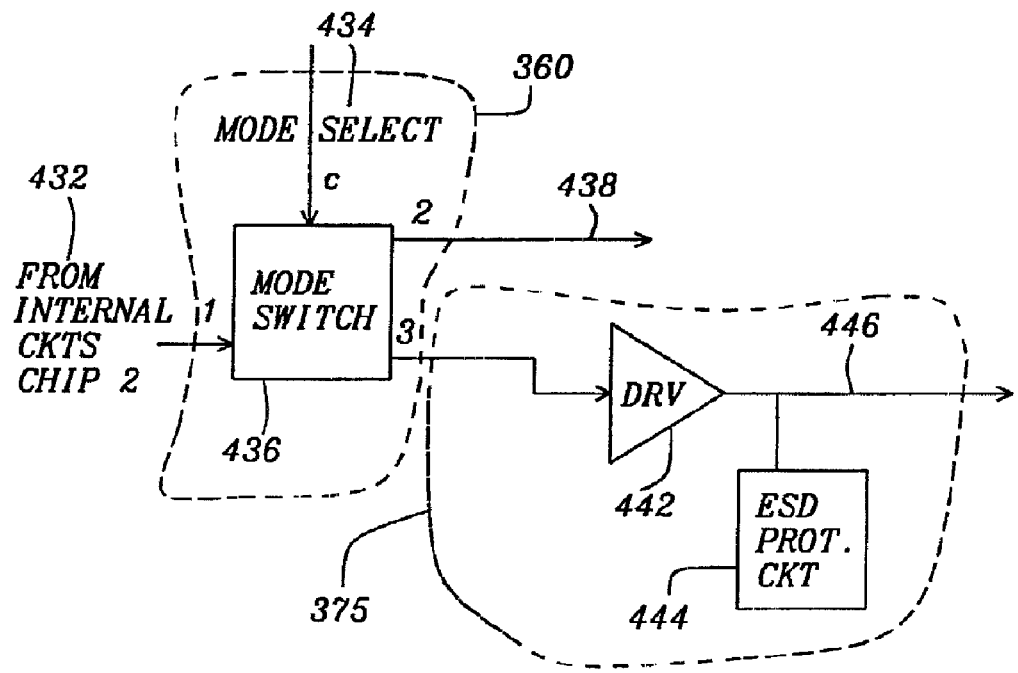
Figure 4D:
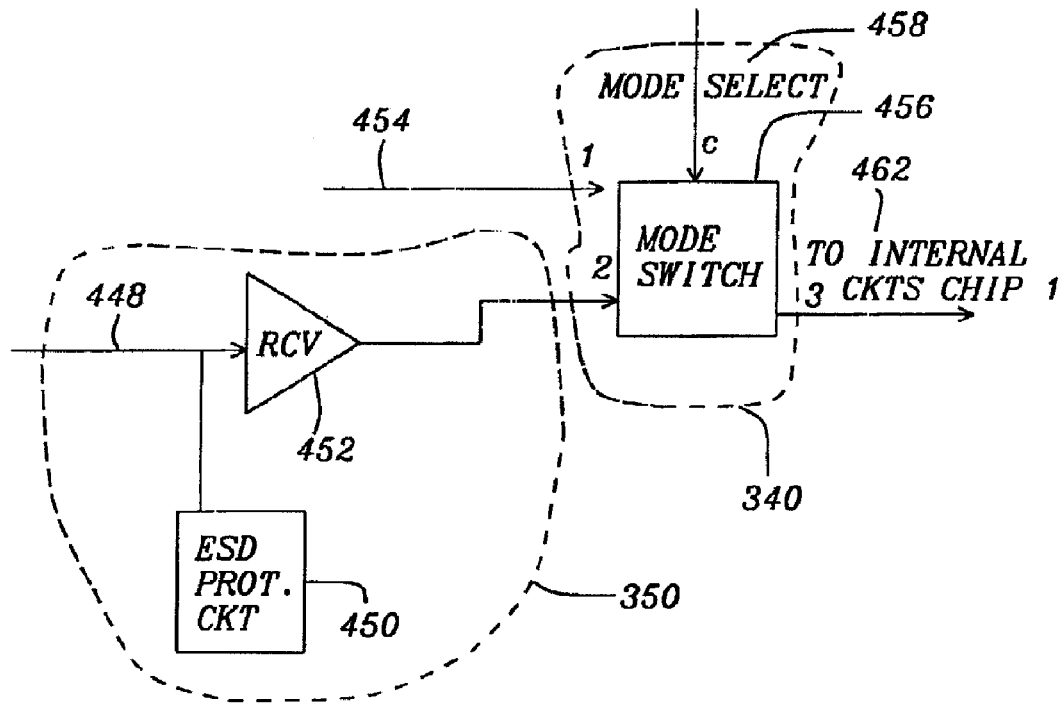

FIGS. 4a and 4d show schematically the connections of the interchip interface 340 and the I/O or test interface 350 of the first integrated circuit chip 305 of FIG. 3. FIG. 4a illustrates a path of a signal originated within the internal circuits 400 of the first integrated circuit chip and FIG. 4d illustrates a path of a signal originated externally and received by the internal circuits 462 of the first integrated circuit chip.

Referring now to FIG. 4a, the interchip interface 340 is comprised of a mode switch 402 and a mode selector 404. The signal 400 originating from the internal circuit of the first integrated circuit chip is connected to a first terminal of the mode switch 402. The second terminal of the mode switch 402 is connected directly to an input/output pad of the first integrated circuit chip and thus to the internal circuits of the second integrated circuit chip or other external circuits, as described above. The third terminal-of the mode switch 402 is connected to the I/O or test interface 350. The I/O or test interface circuit 350 is composed of a driver circuit 410 connected to input/output pad 412 and then to a test probe or burn-in socket or other external probe and to the ESD protection circuit 414. The ESD protection circuit 414 operates as the ESD protection circuit 387 of FIG. 3 and clamps excessive ESD voltage to protect the I/O or test interface circuit 350 from damage during handling of the wafer containing the first integrated circuit chip for manufacturing, assembly, testing, and stand-alone operation.

The control terminal of the mode switch 402 is connected to a mode selector 404 to control the function of the interchip interface 340. The signal to the mode selector comes form the substrate, the second integrated circuit chip, test probe, burn-in socket, or other external source. When the mode selector 404 is at a first logic state (0), the internal circuits 400 of the first integrated circuit chip are connected to the I/O or test interface circuit 350. When the mode selector 404 is at a second logic state (1), the internal circuits 400 of the first integrated circuit chip are connected to the input/output 408 and thus to the internal circuits of the second integrated circuit chip. The mode selector 404 is set to the first state during the testing procedures of the wafer containing the first integrated circuit chip or during stand-alone operation. Conversely, when the mode selector 404 is set to the second logic state during the multi-chip mode operation of the "chip-on-chip" structure.

Referring to FIG. 4d, the signals originating in the internal circuits of the second integrated circuit chip or other external source are transferred to the chip pad 454 of the first integrated circuit. The chip pad 454 is connected to the first terminal of the mode switch 456. The I/O or test interface circuit 350 is connected to the second terminal of the mode switch 456. The third terminal of the mode switch 456 is connected to the internal circuits 462 of the first integrated circuit chip. The control terminal of the mode switch 456 is connected to the mode selector 458 to control the function of the interchip interface 340. The signal to the mode switch comes from the substrate, the second integrated circuit chip, a test probe or burn-in socket, or other external source. If the control terminal of the mode switch 458 is at the first logic state (0), the I/O or test interface circuit 350 is connected to the internal circuit of the first integrated circuit chip. Conversely, if the control terminal of the mode switch 458 is at the second logic state (1), the chip pad 454 of the first integrated circuit chip and thus internal circuits of the second integrated circuit chip are connected to the internal circuits of the first integrated circuit chip.

As described above, the mode selector 458 is set to the first logic state during the testing procedures of the wafer containing the first integrated circuit chip or during stand-alone operation and the mode selector 458 is set to the second logic state during multi-chip operation of the "chip-on-chip" structure.

FIGS. 4b and 4c show schematically the connections of the interchip interface 360 and the I/O or I/O or test interface 375 of the second integrated circuit chip 310 of FIG. 3. FIG. 4c illustrates a, path of a signal originated within the internal circuits 430 of the second integrated circuit chip and FIG. 4b illustrates a path of a signal originated externally and received by the internal circuits 432 of the second integrated circuit chip.

FIG. 4b shows the instance where the signals originate on the first integrated circuit chip or other external source and are transferred through to the input/output pad 422 of the second integrated circuit chip. The input/output pad 422 is connected to the first terminal of the mode switch 424. The I/O or test interface circuit 375 is connected to the second terminal of the mode switch 424. The third terminal of the mode switch 424 is connected to the internal circuits 430 of the second integrated circuit chip. The control terminal of the mode switch 424 is connected to the mode selector 426, which operates as described above. The signal to the mode selector comes from the substrate, the first integrated circuit chip, a test probe or burn-in socket, or other source. If the mode selector is at the first logic state (0), the test signals from an external test system or other I/O source are transferred through the I/O or test interface 375 to the internal circuits 430 of the second integrated circuit chip. Alternatively, if the mode selector 426 is at the second logic state (1), the signals from the internal circuit of the first integrated circuit chip are connected through the input/output pad 422 to the internal circuits 430 of the second integrated circuit chip. Again, as described above, the mode selector 426 is set to the first logic state during testing procedures or single chip mode operation and is set to the second logic state during multi-chip mode operation.

The I/O or test interface is similar to that described in FIG. 4d. The test or I/O signals originating in an external test system, such as from a test probe or burn-in socket or other source, are applied to a test or input/output pad 416. The test or input/output pad 416 is connected to a receiver 420 and ESD protection circuit 418. The receiver 420 translates the test signals to signal levels acceptable by the internal circuits 430 of the second integrated circuit chip. The ESD protection circuit 418 clamps ESD voltages applied to the I/O or test pad 416 to prevent damage to the second integrated circuit chip.

FIG. 4c shows the instance where the signals originate in the internal circuits 432 of the second integrated circuit chip and are transferred through chip pad 438 to the first integrated circuit chip. The first terminal of the mode switch 436 receives the signals from the internal circuits 432 of the second integrated circuit chip. The second terminal of the mode switch 436 is connected to the chip pad 438. The third terminal is connected to the I/O or test interface 375. The control terminal is connected to the mode selector 434.

As described above, the mode selector 434, having an input from the first integrated circuit chip, the substrate, a test probe, or burn-in socket or other external source, determines the connection of the internal circuits 432 to either the chip pad 438 or the I/O or test interface circuit 375. If the mode selector 434 is set to the first logic state (0), the internal circuits 432 are connected to the I/O or test interface circuit 375, to a test probe or other external source for single-chip mode. Alternatively, if the mode selector 434 is at the second logic state, the internal circuits 432 are connected through the chip pad 438 to the internal circuits of the first integrated circuit chip or other external location for multi-chip mode.

Figure 5A:
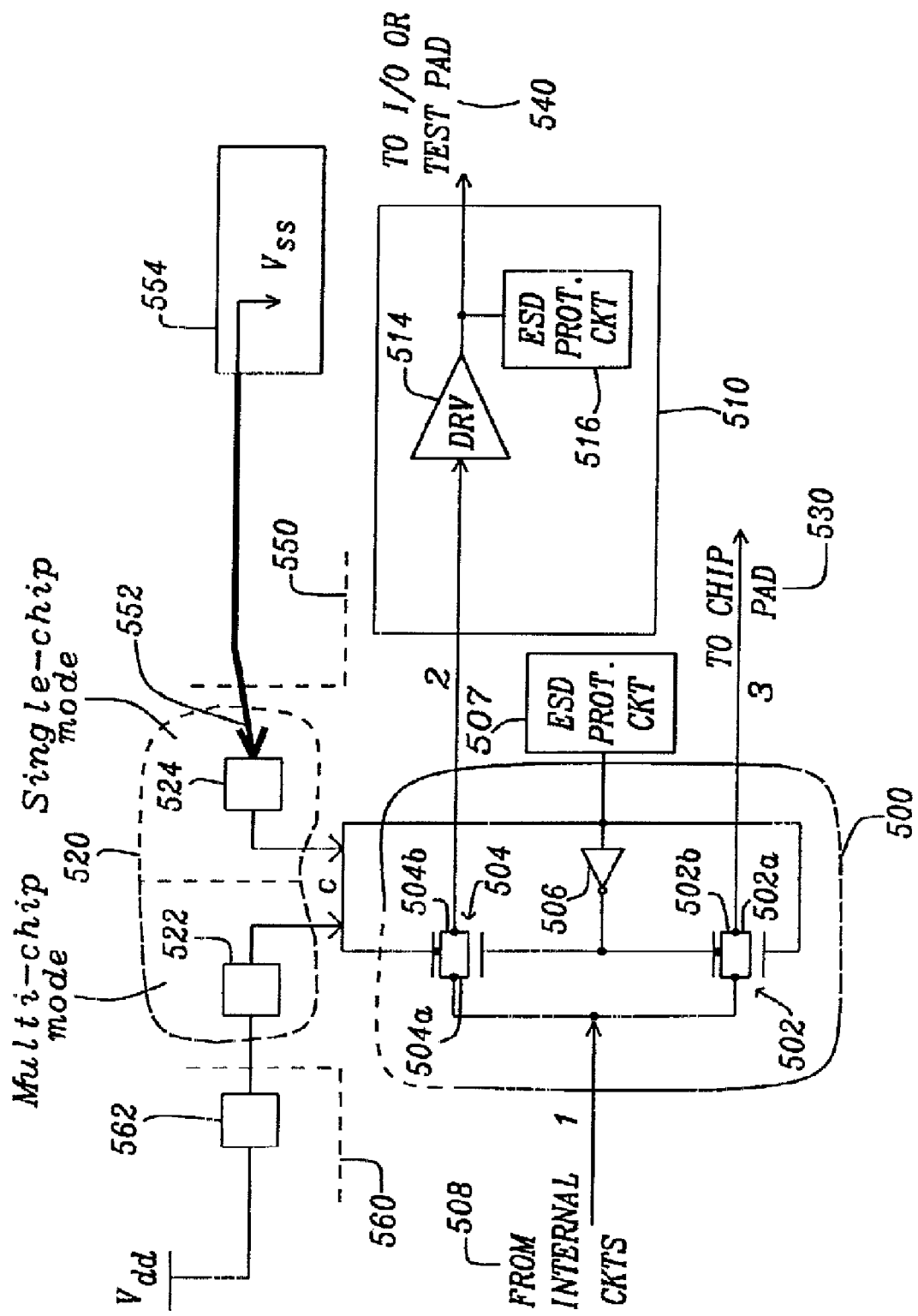
FIGS. 5a and 5b are schematic drawings of an embodiment of the interchip interface of this invention.
Figure 5B:
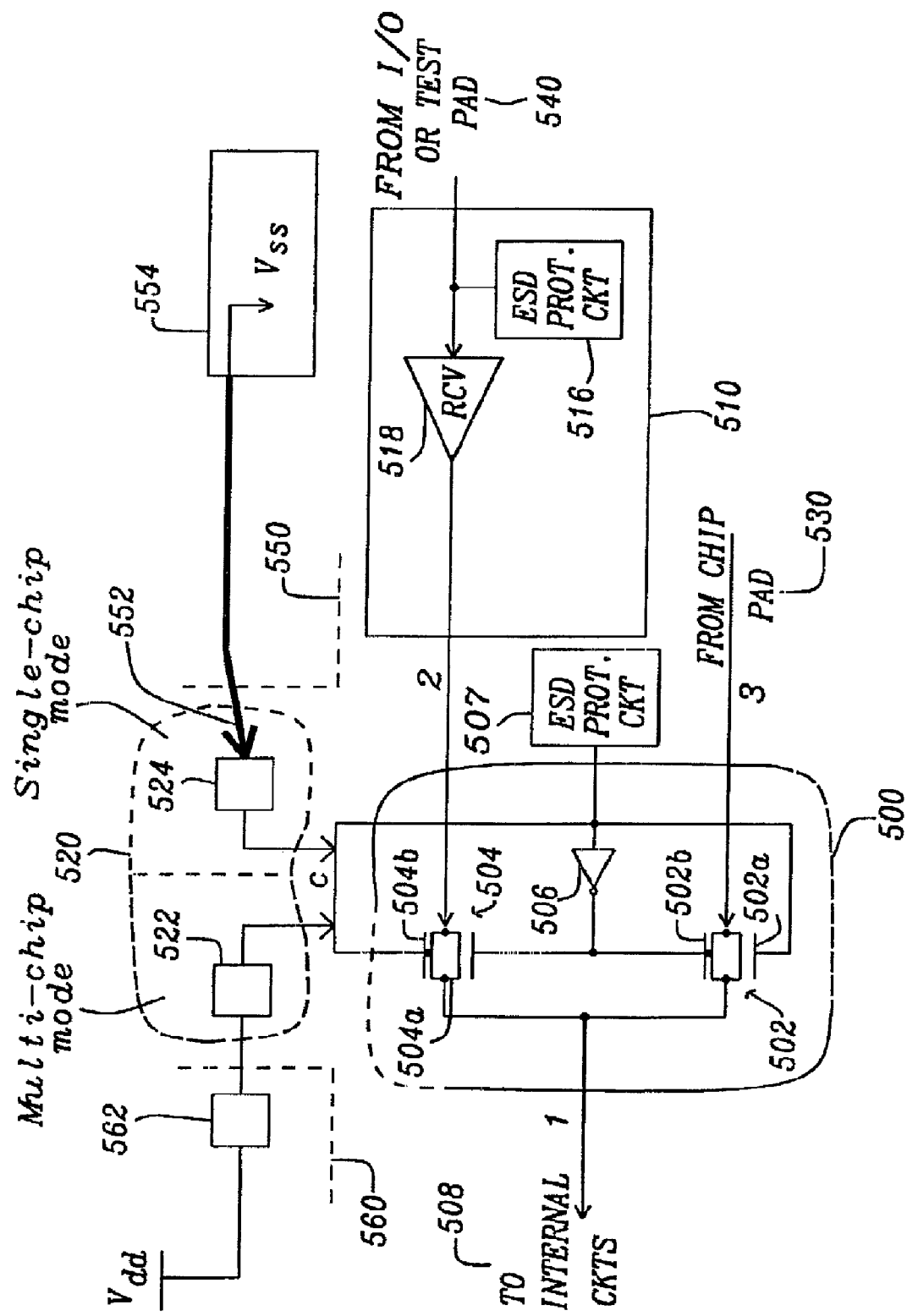

The mode selector 434 is set to the first logic state during single chip operation, including testing procedures and to the second logic state during multi-chip system operation FIGS. 5a and 5b illustrate the structure of a sample embodiment of the mode switch and the mode selector shown in FIGS. 3 and 4a-d. It should be understood by those skilled in the art that the mode switch of the present invention should not be limited to the example illustrated in FIGS. 5a through 5d. It is anticipated that the mode switch can be made in any number of configurations. The key point of the invention is the selectable I/O path design concept.

FIG. 5a shows the mode switch 500 and mode selector 520 for signals originated from the internal circuits 508 from the first or second or other integrated circuit chips. Alternately, FIG. 5b shows the mode switch 500 and mode selector 520 for signals originated externally and transferred to the internal circuits 508 of the first or second or other integrated circuit chips.

Referring now to FIG. 5a, the first terminal of the mode switch 500 is connected to the internal circuits 508, the second terminal of the mode switch 500 is connected to the I/O or test interface circuit 510 and the third terminal of the mode switch 500 is connected to the interchip input/output pad 530. Thus, one of two paths may be selected by the mode switch. The second terminal of the mode switch connects to the path including a driver circuit 514 and an ESD protection circuit 516 to be used for single chip operation. The third terminal connects to the path to the chip pad 530 having no extra loading to be used for multi-chip operation.

The mode switch is comprised of the pass switches 502 and 504 and inverter 506. The pass switch 502 is the parallel combination of the n-channel metal oxide semiconductor (NMOS) transistor 502a and p-channel metal oxide semiconductor (PMOS) transistor 502b. Likewise, the pass switch 504 is the parallel combination of the NMOS transistor 504a and the PMOS transistor 504b. The first terminal of the mode switch 500 and thus the internal circuits 508 are connected to the drains of the pass switches 502 and 504. The sources of the pass switch 502 are connected to the third terminal of the mode switch 500 and thus to the interchip input/output pad 530. The sources of the pass switch 504 are connected to the second terminal of the mode switch 500 and thus to the I/O or test interface circuit 510. The gates of the NMOS transistor 504a and the PMOS transistor 502b are connected to the output of the inverter 506. The gates of the NMOS transistor 502a, PMOS transistor 504b, and the input of the inverter 506 are connected to the control terminal of the mode switch 500 and thus to the mode selector 520.

An ESD protection circuit 507 is added to prevent damage to the mode switch during testing and assembly. After the chip is assembled, the ESD protection circuit will not influence performance of the chip.

When the control terminal of the mode switch 500 is at the first logic state (0), in this case a voltage level approaching that of the substrate biasing voltage source V.sub.SS, the pass switch 504 is turned on and the pass switch 502 is turned off. The internal circuits are now set for single chip operation; for example, the internal circuits may be effectively connected to the I/O or test interface circuit 510. Conversely, when the control terminal of the mode switch 500 is at the second logic state, in this case a voltage level approaching that of the power supply voltage source V.sub.DD, the pass switch 502 is turned on and the pass switch 504 is turned off. This effectively connects the internal circuits 508 to the interchip input/output pad 530. In this logic state, the extra electrical load is from the drain of the pass switch 502 and the pass switch 504. This electrical load is very small and thus highly improved performance can be expected over the prior art.

The I/O or test interface circuit 510 is comprised of the driver circuit 514 and the ESD protection circuit 516: The I/O or test interface circuit functions as described in FIGS. 4a and 4c.

The mode select circuit is the interchip input/output pad 522 and the I/O or test input/output pad 524 connected together and to the control terminal of the mode switch 500. The interchip input/output pad 522 is connected as described in FIG. 3 to a mating interchip input/output pad 562 that are joined by a solder bump or ball. The mating interchip input/output pad 562 is on the mating chip 560 and is connected to the power supply voltage source V.sub.DD to provide the second logic state to the control terminal of the mode switch 500 during multichip mode operation. The I/O or test input/output pad is connected to an external source 550 during single chip operation. For example, during testing, a test probe or needle 552 is brought in contact with the test input/output pad. The test probe or needle 552 is connected on a probe card 554 within the test system 550 to the substrate biasing voltage source V.sub.SS to provide the first logic state to the control terminal of the mode switch 500. The external source 550 could also be from a substrate or a printed circuit board, and so on.

The fundamental connections shown in FIG. 5b are as described in FIG. 5a except the I/O signal originates from an external system attached to the input/output pad 540. The I/O or test interface circuit 510 in this case is comprised of the receiver 518 and the ESD protection circuit and functions as described in FIGS. 4b and 4d.

Signals originating from the external circuits are applied to the interchip input/output pad 530 and transferred through the pass switch 502 to the internal circuits 508 during multi-chip mode operation. Likewise, the external signals are transferred from the I/O or test interface 510 through the pass switch 504 to the internal circuits 508 during single chip operation.

Figure 5C:
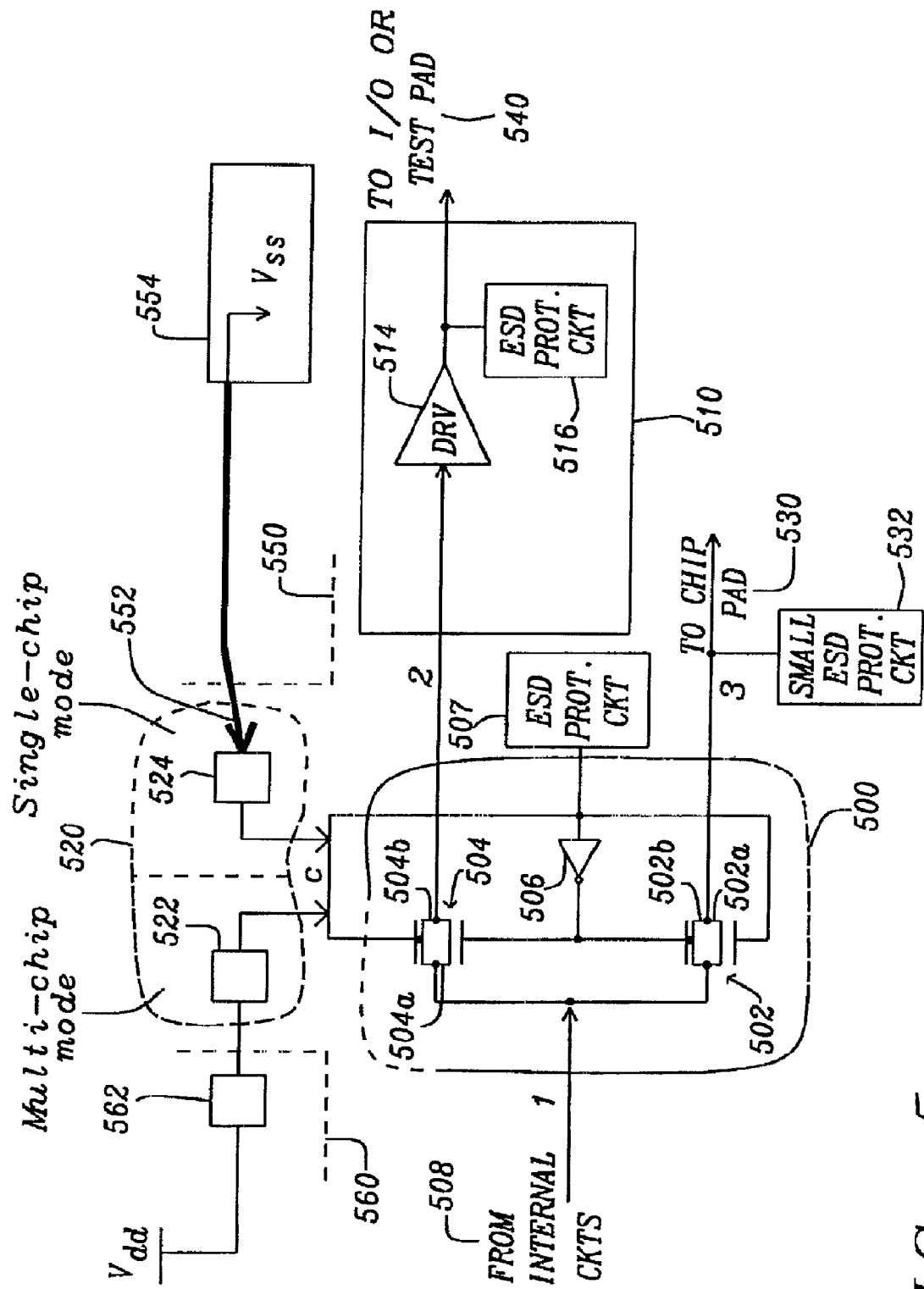
FIGS. 5c and 5d are schematic drawings of an alternative embodiment of the interchip interface of this invention.
Figure 5D:
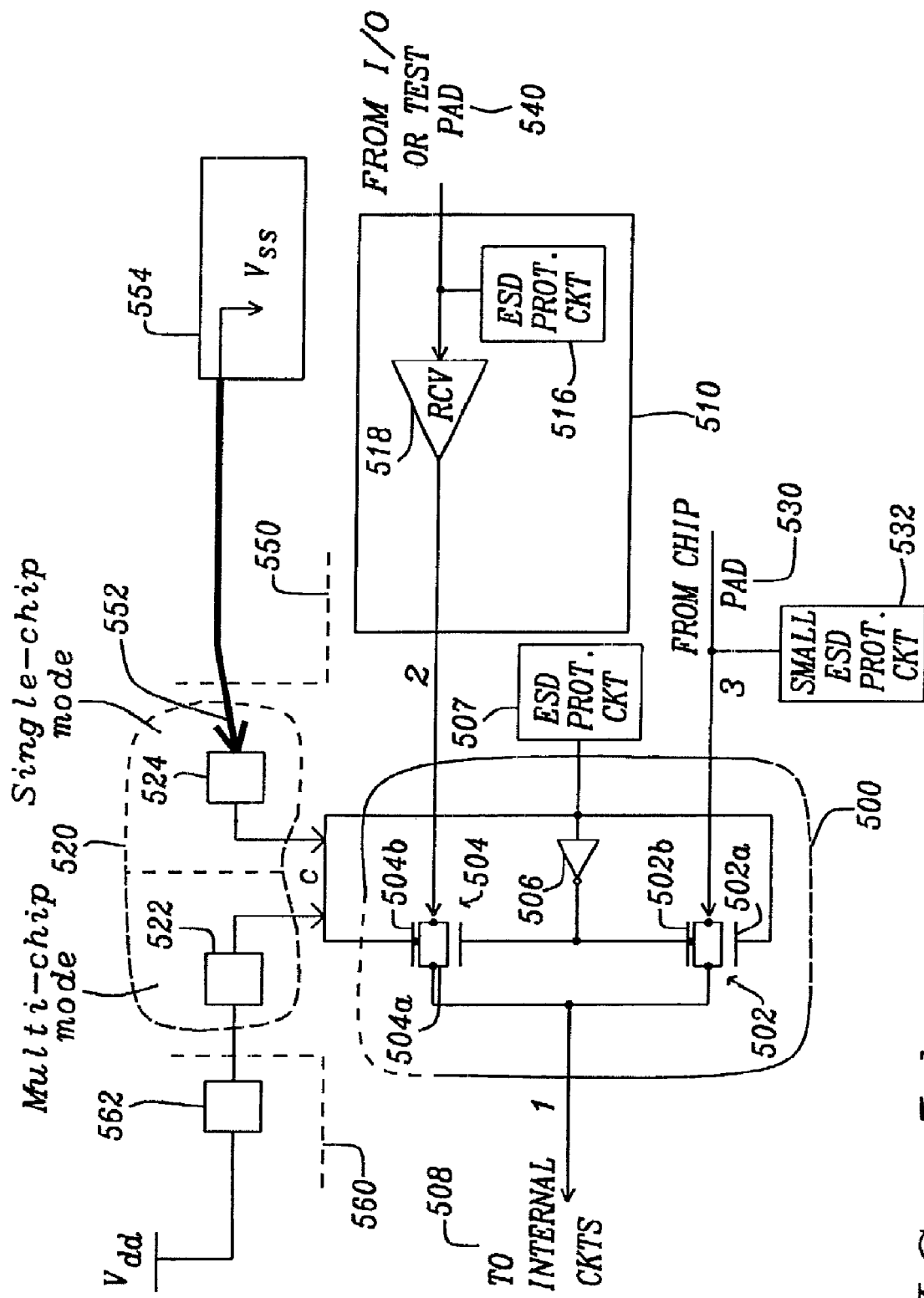

It is preferred not to have ESD protection on node 3 of the circuit connected to the, input/output pad 530 because ESD loading will impact chip performance after assembly. However, ESD may impact this node during testing and assembly, for example. Therefore, a small ESD protection circuit 532 may be added on this node, as shown in FIG. 5c (corresponding to FIG. 5a) and FIG. 5d (corresponding to FIG. 5b).

Figure 6A:
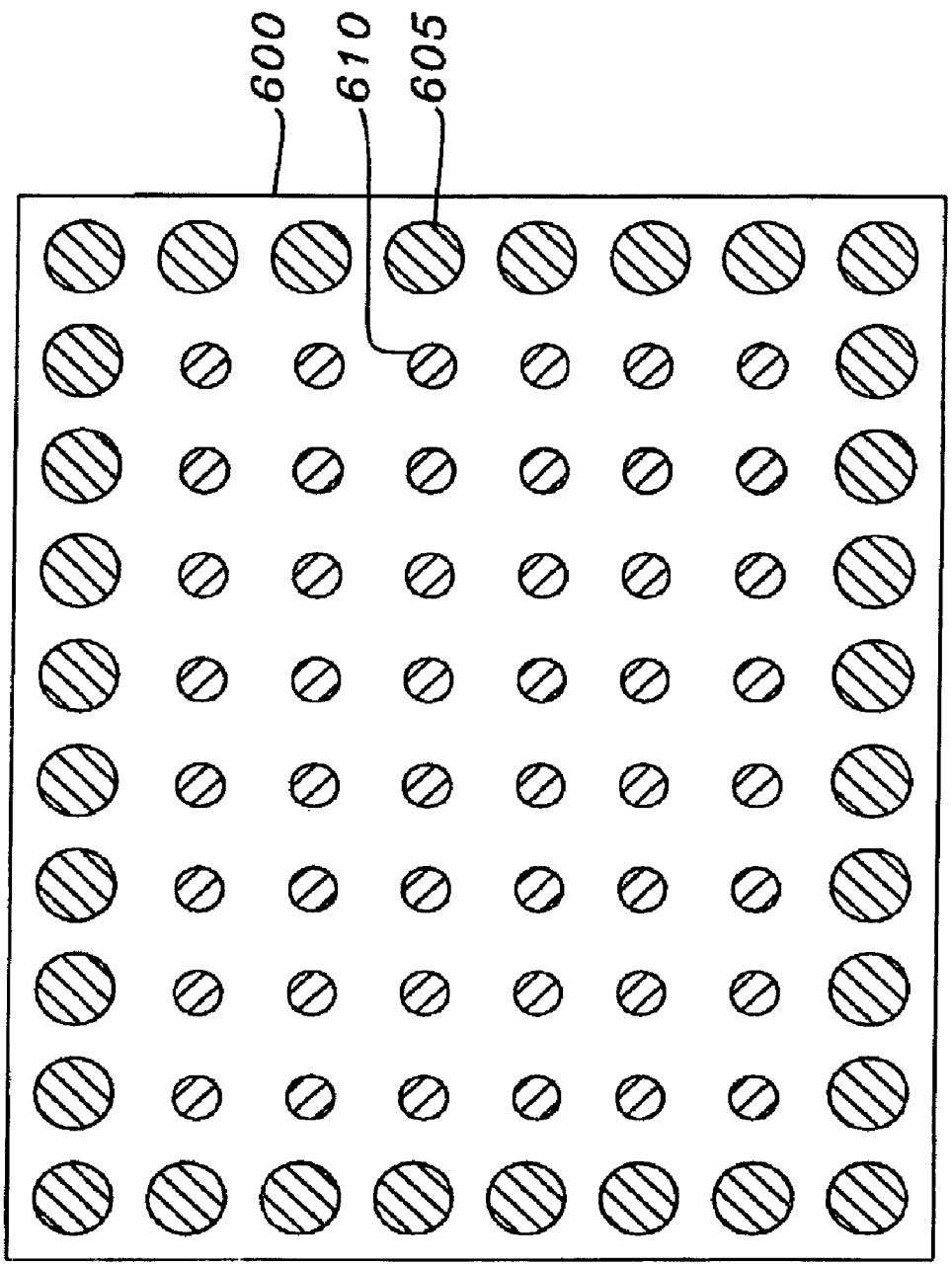
FIGS. 6a and 6b are top surface views of the first and second integrated circuit chips of FIG. 3 showing test pads and interchip input/output pads of this invention.

FIG. 6a shows a top surface view of the first integrated circuit chip 600 illustrating the placement of the test input/output pads 605 and the interchip input/output pads 610. The interchip input/output pads 610 form an area array of solder balls or bumps 315 of FIG. 3. The I/O or test input/output pads 605 are peripherally arranged so that the test probes or needles of the test system can conveniently make contact with the test input/output pads 605.

Figure 6B:
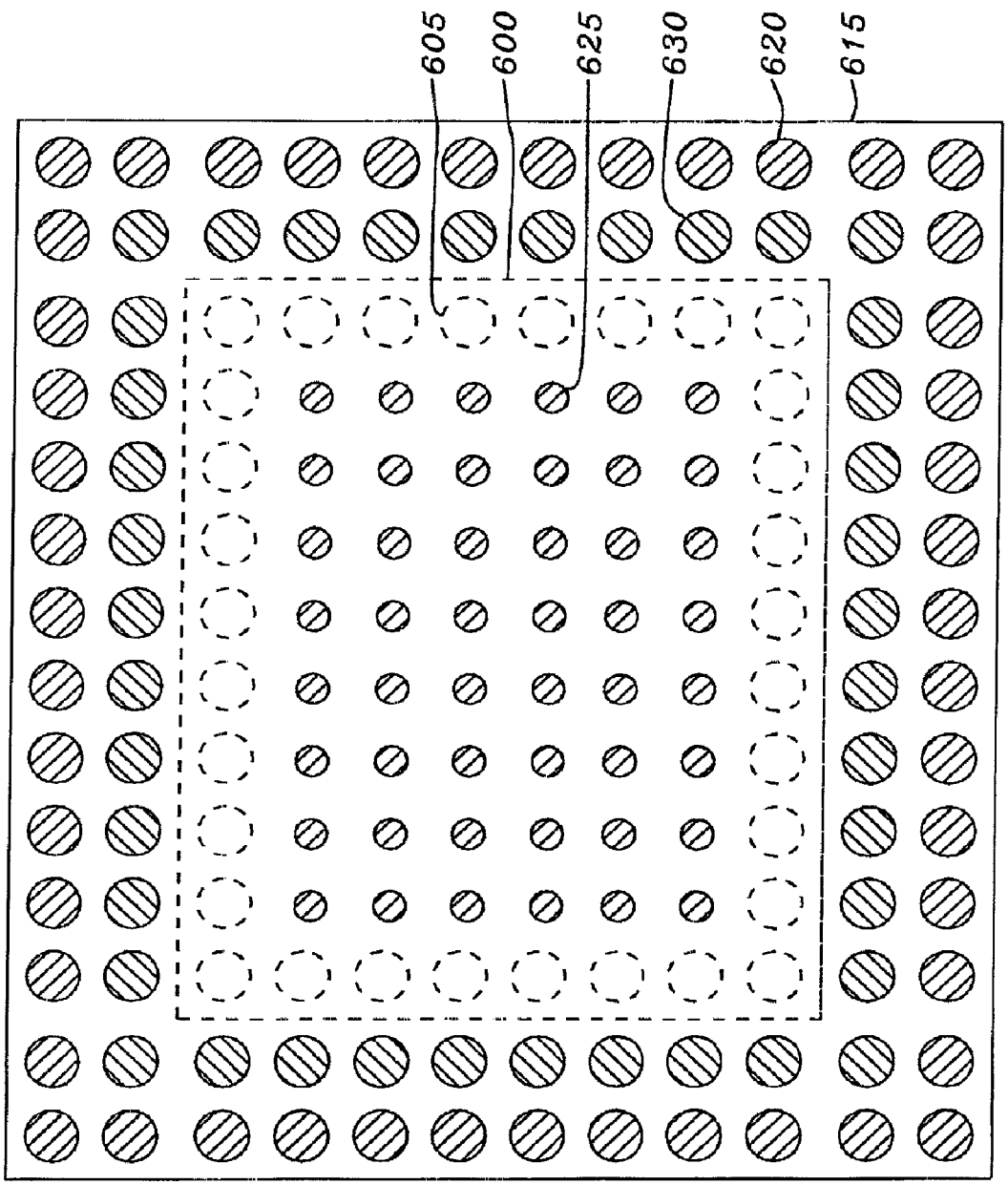

FIG. 6b shows the top surface view of the second integrated circuit chip 615 illustrating the placement of the interchip input/output pads 625 and the external input/output pads 620. The interchip input/output pads 625 form the area array to mate with the interchip input/output pads 610 of FIG. 5a. The first integrated circuit chip 600 is mounted "face-to face" to the second integrated circuit chip 615. The test input/output pads 605 must have nothing on the surface of the second integrated circuit chip 625 in their "shadow."

The test input/output pads 630 and the external input/output pads 620 are formed in the periphery of the second integrated circuit chip 615. The external input/output pads 620 must be placed outside the shadow of the first integrated circuit chip 600. The test input/output pads 630 are placed conveniently so that test probes or needles of a test system can contact the test input/output pads 630. The test input/output pads 605 and 630 are connected as shown in FIGS. 5a and 5b to the I/O or test interface 510. The test input/output pads 605 and 630 transfer stimulus and response signals between the test system 550 and either the first integrated circuit chip 600 or second integrated circuit chip 615.

While this invention has been particularly shown and described with reference to the preferred embodiments thereof, it will be understood by those skilled in the art that various changes in form and details may be made without departing from the spirit and scope of the invention.

What is claimed is:

1. An integrated circuit chip comprising:
   a test interface circuit comprising a receiver and a first electrostatic discharge protection circuit connected to a first terminal of said receiver;
   a first signal input/output pad connected to said first terminal of said receiver and to said first electrostatic discharge protection circuit;
   an internal circuit; and
   a second signal input/output pad, wherein no test interface circuit in said integrated circuit chip is in a signal path between said internal circuit and said second signal input/output pad.

2. The integrated circuit chip of claim 1 further comprising a metal oxide semiconductor transistor in said signal path, wherein said metal oxide semiconductor transistor has a first terminal connected to said second signal input/output pad and a second terminal connected to said internal circuit, a connecting pad connected to a gate of said metal oxide semiconductor transistor, and a second electrostatic discharge protection circuit connected to said gate of said metal oxide semiconductor transistor and to said connecting pad.

3. The integrated circuit chip of claim 2, wherein said connecting pad is configured for connecting to a power supply voltage source.

4. The integrated circuit chip of claim 1 further comprising a metal oxide semiconductor transistor having a first terminal connected to a second terminal of said receiver and a second terminal connected to said internal circuit, a connecting pad connected to a gate of said metal oxide semiconductor transistor, and a second electrostatic discharge protection circuit connected to said gate of said metal oxide semiconductor transistor and to said connecting pad.

5. The integrated circuit chip of claim 4, wherein said connecting pad is configured for connecting to a ground source.

6. The integrated circuit chip of claim 1 further comprising a metal bump on said second signal input/output pad, wherein said metal bump comprises a solder.

7. The integrated circuit chip of claim 1, wherein said first signal input/output pad is configured for testing.

8. The integrated circuit chip of claim 1 further comprising a metal bump on said second signal input/output pad.

9. An integrated circuit chip comprising:
   a test interface circuit comprising a receiver and a first electrostatic discharge protection circuit connected to a first terminal of said receiver;
   a first signal input/output pad connected to said first terminal of said receiver and to said first electrostatic discharge protection circuit;
   an internal circuit;
   a second signal input/output pad, wherein no test interface circuit in said integrated circuit chip is in a signal path between said internal circuit and said second signal input/output pad; and
   a second electrostatic discharge protection circuit connected to said second signal input/output pad, wherein said second electrostatic discharge protection circuit is smaller than said first electrostatic discharge protection circuit.

10. The integrated circuit chip of claim 9 further comprising a metal oxide semiconductor transistor in said signal path, wherein said metal oxide semiconductor transistor has a first terminal connected to said second signal input/output pad and a second terminal connected to said internal circuit, a connecting pad connected to a gate of said metal oxide semiconductor transistor, and a third electrostatic discharge protection circuit connected to said gate of said metal oxide semiconductor transistor and to said connecting pad.

11. The integrated circuit chip of claim 10, wherein said connecting pad is configured for connecting to a power supply voltage source.

12. The integrated circuit chip of claim 9 further comprising a metal oxide semiconductor transistor having a first terminal connected to a second terminal of said receiver and a second terminal connected to said internal circuit, a connecting pad connected to a gate of said metal oxide semiconductor transistor, and a third electrostatic discharge protection circuit connected to said gate of said metal oxide semiconductor transistor and to said connecting pad.

13. The integrated circuit chip of claim 12, wherein said connecting pad is configured for connecting to a ground source.

14. The integrated circuit chip of claim 9 further comprising a metal bump on said second signal input/output pad, wherein said metal bump comprises a solder.

15. The integrated circuit chip of claim 9, wherein said first signal input/output pad is configured for testing.

16. The integrated circuit chip of claim 9 further comprising a metal bump on said second signal input/output pad.

17. An integrated circuit chip comprising:
   a test interface circuit comprising a receiver and a first electrostatic discharge protection circuit connected to a first terminal of said receiver;
   a first signal input/output pad connected to said first terminal of said receiver and to said first electrostatic discharge protection circuit;
   an internal circuit; and
   a second signal input/output pad, wherein no test interface circuit in said integrated circuit chip is in a signal path between said internal circuit and said second signal input/output pad, wherein no electrostatic discharge protection circuit in said integrated circuit chip is connected to said second signal input/output pad.

18. The integrated circuit chip of claim 17 further comprising a metal oxide semiconductor transistor in said signal path, wherein said metal oxide semiconductor transistor has a first terminal connected to said second signal input/output pad and a second terminal connected to said internal circuit, a connecting pad connected to a gate of said metal oxide semiconductor transistor, and a second electrostatic discharge protection circuit connected to said gate of said metal oxide semiconductor transistor and to said connecting pad.

19. The integrated circuit chip of claim 18, wherein said connecting pad is configured for connecting to a power supply voltage source.

20. The integrated circuit chip of claim 17 further comprising a metal oxide semiconductor transistor having a first terminal connected to a second terminal of said receiver and a second terminal connected to said internal circuit, a connecting pad connected to a gate of said metal oxide semiconductor transistor, and a second electrostatic discharge protection circuit connected to said gate of said metal oxide semiconductor transistor and to said connecting pad.

21. The integrated circuit chip of claim 20, wherein said connecting pad is configured for connecting to a ground source.

22. The integrated circuit chip of claim 17 further comprising a metal bump on said second signal input/output pad, wherein said metal bump comprises a solder.

23. The integrated circuit chip of claim 17, wherein said first signal input/output pad is configured for testing.

24. The integrated circuit chip of claim 17 further comprising a metal bump on said second signal input/output pad.

25. An integrated circuit chip comprising:
an internal circuit;
a first signal input/output pad, wherein a signal path is between said internal circuit and said first signal input/output pad;
a first electrostatic discharge protection circuit connected to said first signal input/output pad;
a metal bump on said first signal input/output pad;
a receiver;
a second electrostatic discharge protection circuit connected to a first terminal of said receiver, wherein said first electrostatic discharge protection circuit is smaller than said second electrostatic discharge protection circuit; and
a second signal input/output pad connected to said first terminal of said receiver and to said second electrostatic discharge protection circuit, wherein there is no metal bump on said second signal input/output pad.

26. The integrated circuit chip of claim 25 further comprising a metal oxide semiconductor transistor in said signal path, wherein said metal oxide semiconductor transistor has a first terminal connected to said first signal input/output pad and a second terminal connected to said internal circuit, a connecting pad connected to a gate of said metal oxide semiconductor transistor, and a third electrostatic discharge protection circuit connected to said gate of said metal oxide semiconductor transistor and to said connecting pad.

27. The integrated circuit chip of claim 26, wherein said connecting pad is configured for connecting to a power supply voltage source.

28. The integrated circuit chip of claim 25 further comprising a metal oxide semiconductor transistor having a first terminal connected to a second terminal of said receiver and a second terminal connected to said internal circuit, a connecting pad connected to a gate of said metal oxide semiconductor transistor, and a third electrostatic discharge protection circuit connected to said gate of said metal oxide semiconductor transistor and to said connecting pad.

29. The integrated circuit chip of claim 28, wherein said connecting pad is configured for connecting to a ground source.

30. The integrated circuit chip of claim 25, wherein said metal bump comprises a solder.

31. The integrated circuit chip of claim 25, wherein said metal bump is configured for connecting said integrated circuit chip to another integrated circuit chip.

* * * * *